United States Patent
Shih et al.

(10) Patent No.: US 6,808,747 B1
(45) Date of Patent: Oct. 26, 2004

(54) COATING BORON CARBIDE ON ALUMINUM

(76) Inventors: Hong Shih, 2125 Abrazo La., West Covina, CA (US) 91791; Nianci Han, 395 Año Nuevo Ave., #1213, Sunnyvale, CA (US) 94086

(*) Notice: Subject to any disclaimer, the term of this patent is extended or adjusted under 35 U.S.C. 154(b) by 0 days.

(21) Appl. No.: 09/489,356

(22) Filed: Jan. 21, 2000

Related U.S. Application Data

(62) Division of application No. 08/770,092, filed on Dec. 19, 1996, now Pat. No. 6,120,640.

(51) Int. Cl.[7] .......................... C23C 16/22; C23C 16/32
(52) U.S. Cl. ................... 427/249.5; 427/249.1; 427/255.11; 427/255.28; 118/715
(58) Field of Search .................. 427/450, 454; 101/453, 458, 463.1; 156/155, 345.1; 428/217, 615

(56) References Cited

U.S. PATENT DOCUMENTS

| | | | | |
|---|---|---|---|---|
| 3,929,591 A | * | 12/1975 | Chu et al. | 205/127 |
| 3,935,080 A | * | 1/1976 | Gumbinner et al. | 101/459 |
| 3,980,539 A | * | 9/1976 | Lloyd et al. | 101/459 |
| 3,988,217 A | * | 10/1976 | Ikegaya | 205/106 |
| 4,716,083 A | | 12/1987 | Eichen et al. | 428/457 |
| 4,794,044 A | * | 12/1988 | Arai et al. | 427/391 |
| 5,089,746 A | | 2/1992 | Rosenblum et al. | 315/111.81 |
| 5,104,514 A | * | 4/1992 | Quartarone | 205/203 |
| 5,141,656 A | * | 8/1992 | Rountree | 427/290 |
| 5,149,386 A | * | 9/1992 | Smits et al. | 156/233 |
| 5,156,720 A | * | 10/1992 | Rosenfeld et al. | 156/233 |
| 5,217,700 A | * | 6/1993 | Kurihara et al. | 117/102 |

(List continued on next page.)

FOREIGN PATENT DOCUMENTS

| | | | |
|---|---|---|---|
| EP | 0016252 A1 | 10/1980 | |
| GB | 1317617 | 5/1973 | |
| JP | 58 034385 | 2/1983 | |
| JP | 01-208446 | 8/1989 | |
| JP | 408176782 A | * 7/1996 | ............. C23C/4/04 |
| JP | 09 087072 | 3/1997 | |
| JP | 63-203098 | * 8/1998 | ........... H04R/31/00 |
| JP | 363203098 A | * 9/1998 | ............ H04R/7/02 |

OTHER PUBLICATIONS

J. Linke et al. Behavior of Boron Doped Graphites, Plasma Sprayed Boron Carbides and a–C/B:H as Plasma Facing Material, J. Fusion Tech. V.20, pp. 228–231, Sep. 1991.*

(List continued on next page.)

Primary Examiner—Jeffrie R Lund
Assistant Examiner—Rudy Zervigon
(74) Attorney, Agent, or Firm—Charles S. Guenzer; Joseph Bach

(57) ABSTRACT

A method of depositing boron carbide on an aluminum substrate, particularly useful for a plasma etch reactor having interior surfaces facing the plasma composed of boron carbide, preferably principally composed of $B_4C$. Although in this application, the boron carbide may be a bulk sintered body, in the method of the invention it may be a layer of boron carbide coated on an aluminum chamber part. The boron carbide coating may be applied by thermal spraying, such as plasma spraying, by chemical vapor deposition, or by other layer forming technique such as a surface converting reaction. The boron carbide is highly resistant to high-density plasma etchants such as $BCl_3$. The plasma sprayed coating is advantageously applied to only a portion of an anodized aluminum wall. The boron carbide may be sprayed over the exposed portion of an aluminum substrate over which the anodization has been removed. A band of the aluminum substrate at the transition between the anodization and the boron carbide is roughened prior to anodization so that the boron carbide sticks to the correspondingly roughened surface of the anodization. Alternatively, the entire wall area of the anodized aluminum to be coated is roughened, and the boron carbide is sprayed over the anodization.

22 Claims, 6 Drawing Sheets

U.S. PATENT DOCUMENTS

| | | | |
|---|---|---|---|
| 5,268,200 A | | 12/1993 | Steger .......................... 427/249 |
| 5,271,967 A | * | 12/1993 | Kramer et al. ............... 427/455 |
| 5,272,417 A | | 12/1993 | Ohmi ..................... 315/111.21 |
| 5,429,870 A | | 7/1995 | Kmetz et al. ................ 428/368 |
| 5,635,254 A | * | 6/1997 | Holcombe et al. .......... 427/122 |
| 5,714,243 A | * | 2/1998 | Mammino et al. .......... 427/447 |
| 5,775,977 A | * | 7/1998 | Platzer et al. ............. 15/DIG. 6 |
| 5,838,530 A | * | 11/1998 | Zhang ......................... 257/530 |
| 5,858,122 A | * | 1/1999 | Tani et al. ................... 148/243 |

OTHER PUBLICATIONS

Ponnekanti, S., et al, "Failure mechanisms of anodized aluminum parts used in chemical vapor deposition chambers", J. Vac.Sci. Tech.A14(3) May 1996.*

C.J.Smithells, et al, "Metals reference book", V.III 1967.*

Mizuhara, H., "Ceramic/Metal Seals", Engineering Materials Handbook, V4 (Materials Information Society, 1991),pp. 502–510 Jan. 1991.*

Raeder, H. et al, "Grind/Polish", Engineering Materials Handbook, V4 (Materials Information Society, 1991),pp. 464–470 Jan. 1991.*

Reinhart, J., "Adhesive Bonding Surface Preparation", Engineering Materials Handbook, V1 (Materials Information Society, 1991),pp. 681–682 Jan. 1991.*

Partial European Search Report.

Shaffer, "Engineering Properties of Carbides, " *Engineered Materials Handbook*, vol. 4, "Ceramics and Glasses" (Materials Information Society, 1991), pp. 804–807, 843, 844.

Linke et al., "Behavior of Boron Doped Graphites, Plasma Sprayed Boron Carbides and a–C/B:H as Plasma Facing Material, " *J. Fusion Technology*.

* cited by examiner

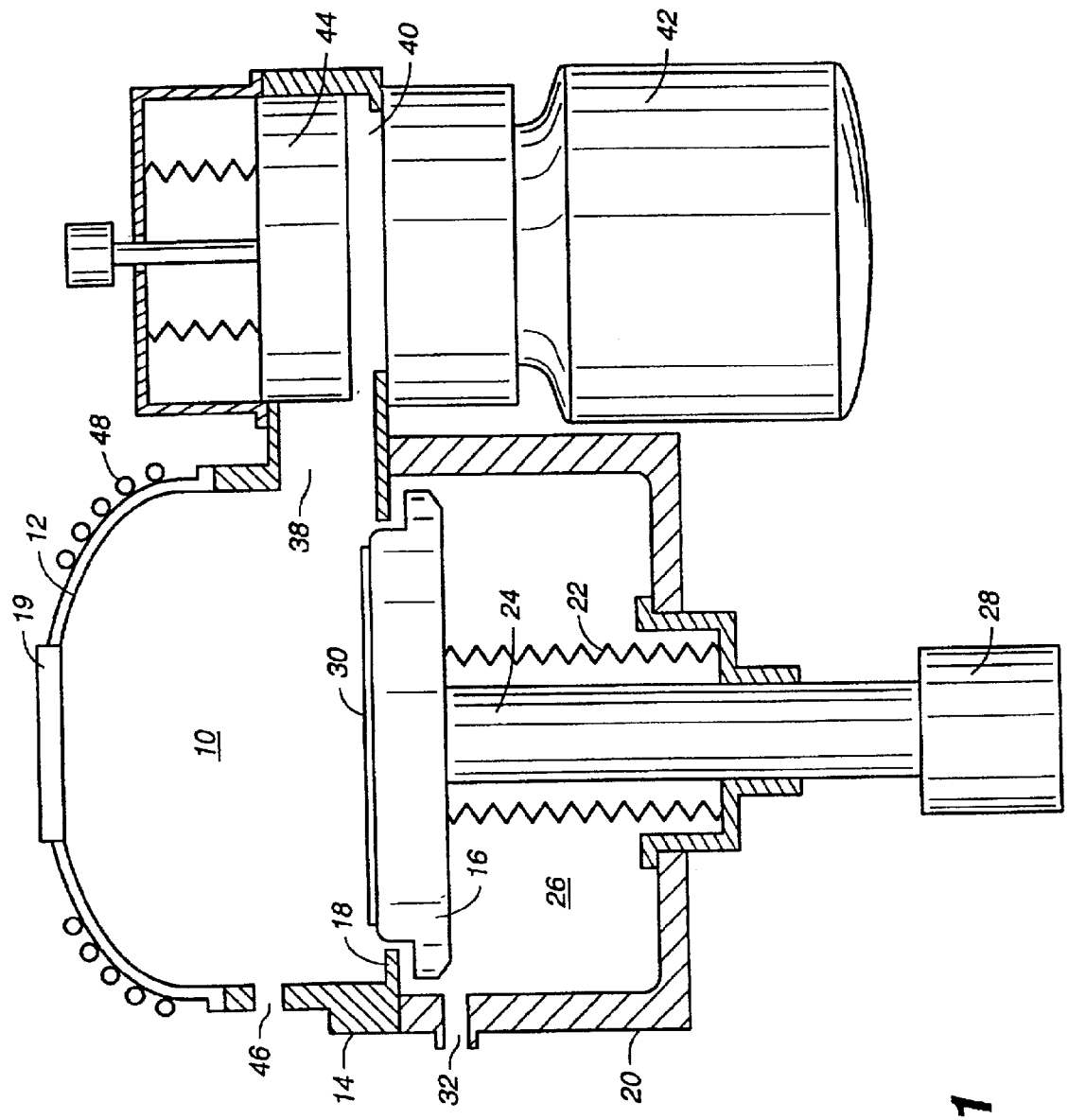
FIG._1

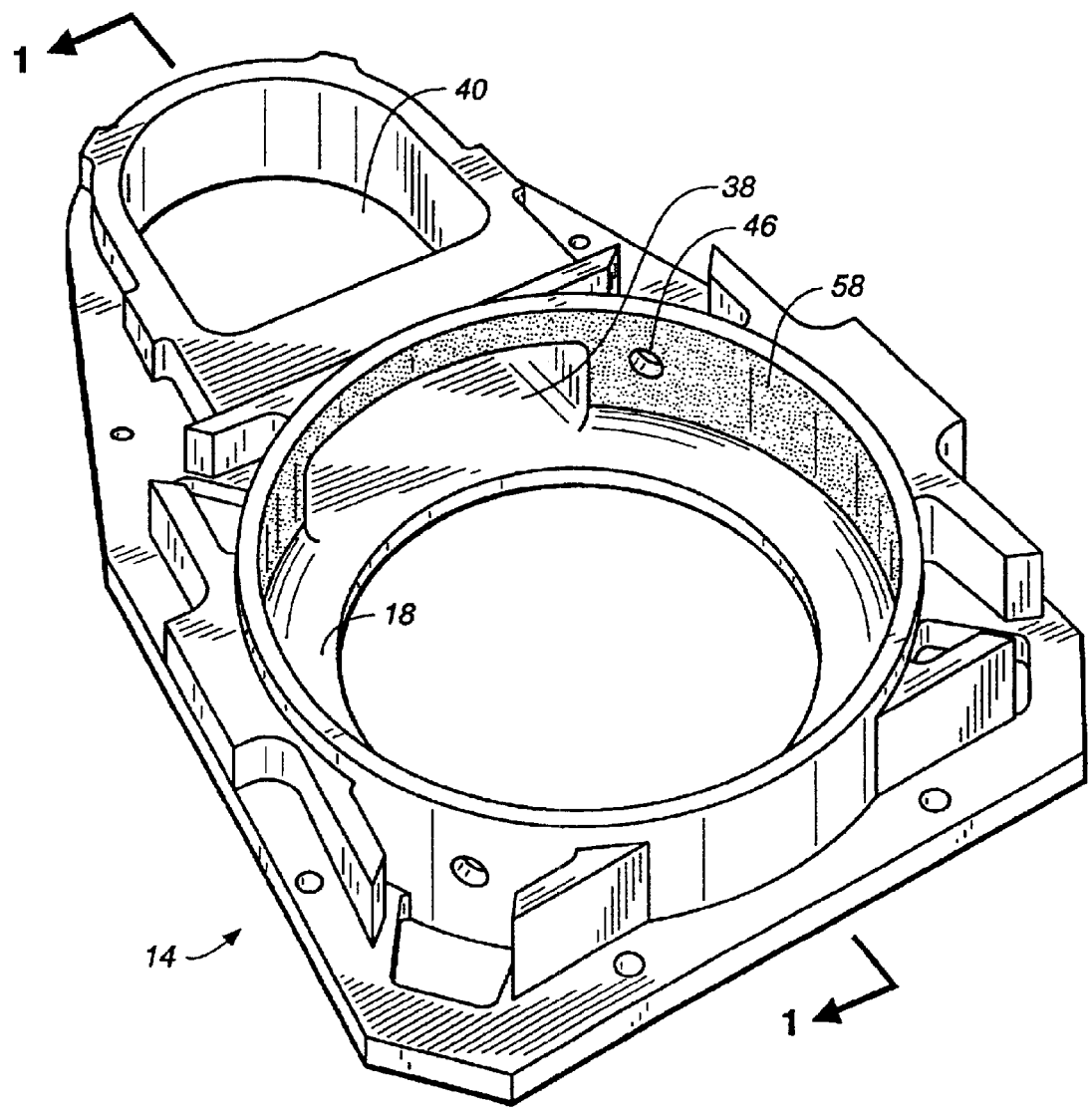
FIG._2

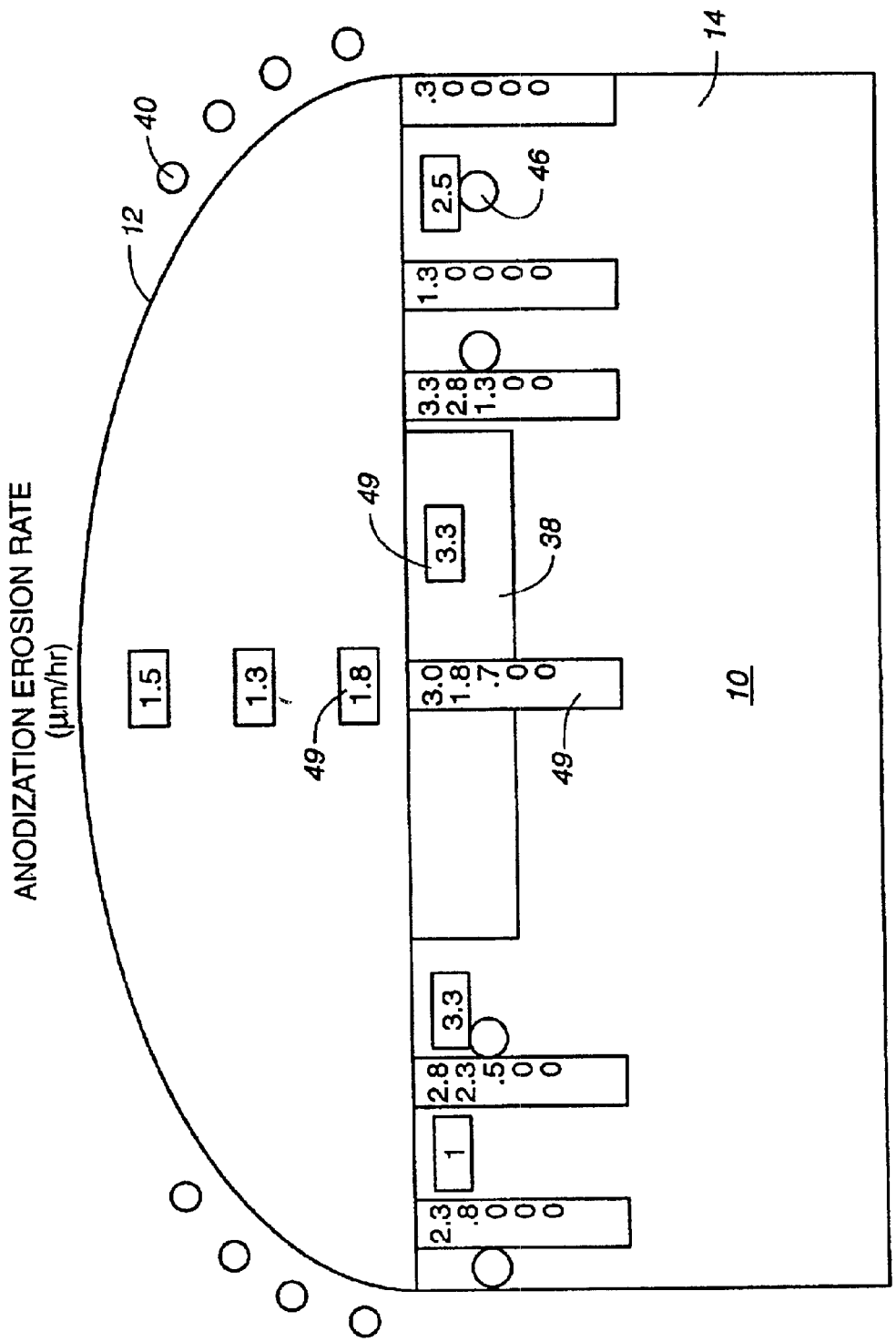
FIG._3

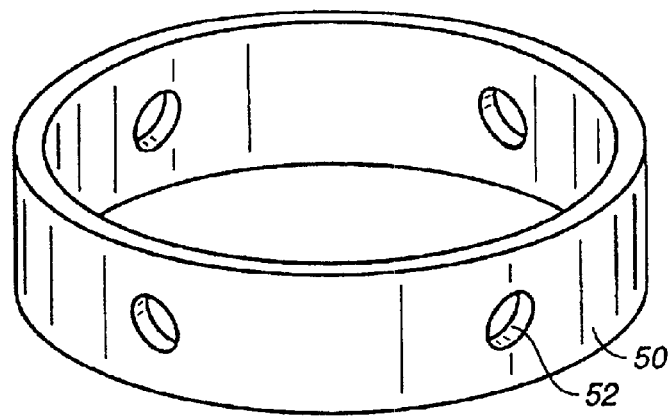
FIG._4
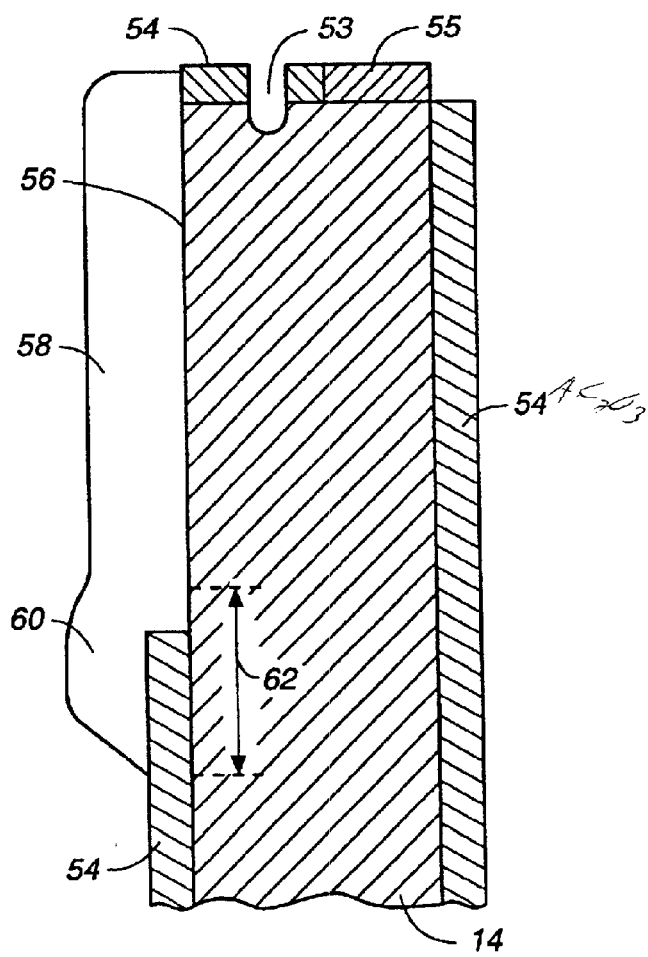
FIG._5

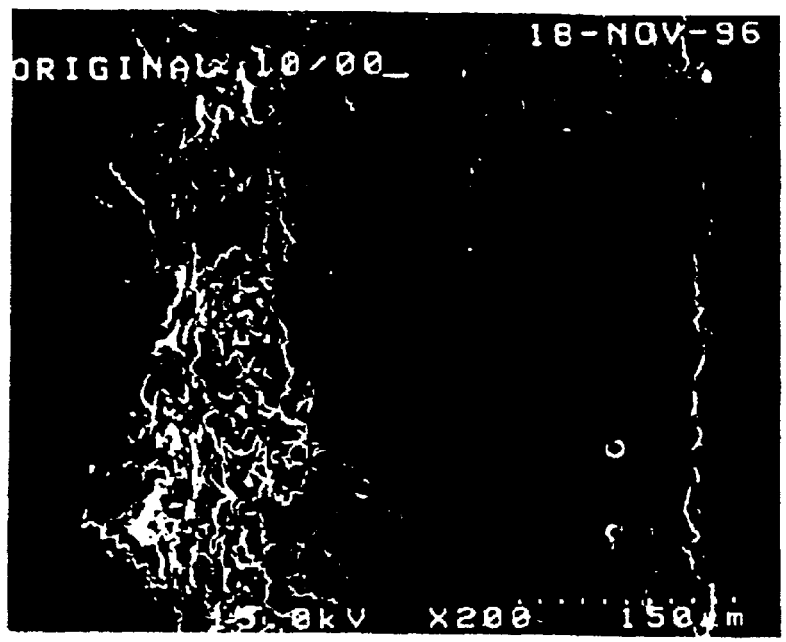
FIG._6
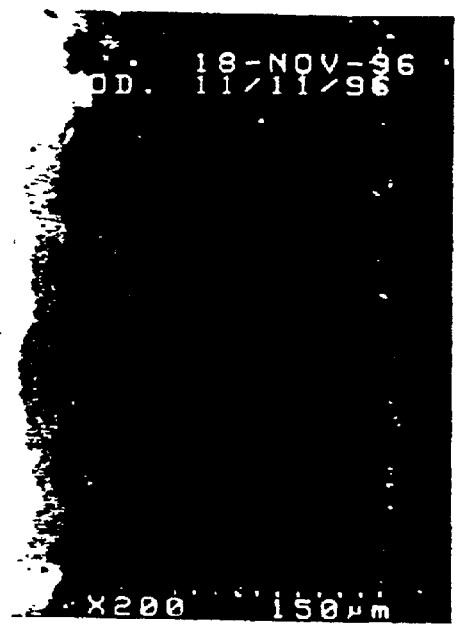
FIG._7

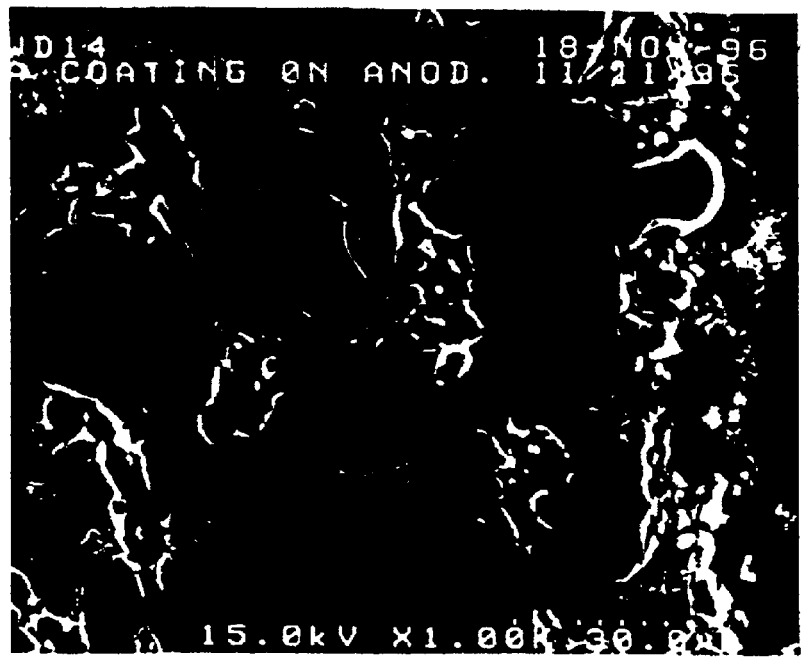
FIG._8
FIG._9

COATING BORON CARBIDE ON ALUMINUM

RELATED APPLICATIONS

This application is a division of Ser. No. 08/770,092, filed Dec. 19, 1996 now U.S. Pat. No. 6,120,640 and the issue fee of which is paid.

FIELD OF THE INVENTION

The invention relates generally to a composite stock piece of a coated metal substrate and to the resulting product, in particular aluminum coated with a protective layer of boron carbide, which is particularly useful for chamber walls and other parts facing a corrosive plasma.

BACKGROUND ART

Dry plasma etching is the preferred process for etching features on a silicon wafer having semiconductor integrated circuits partially developed in it. Typically, one or more planar layers are deposited over the previously defined substrate, and a layer of photoresist mask or a hard mask is deposited over the planar layers and patterned to leave apertures exposing portions of the planar layers. An etching gas admitted into the etching reactor is then excited into a plasma state, and it acts on the portions of the planar layers exposed by the mask to remove those exposed portions. The plasma etching process has proved to be very effective at defining extremely small features with low production of deleterious particles.

The field of plasma etching is typically divided among silicon etching, oxide etching, and metal etching. Each uses its preferred chemistry and presents its own problems. However, many problems are common among them, and the etching chambers dedicated to different ones of the uses tend to resemble each other. Such commonality of design offers an opportunity for savings.

The most prevalent use of metal etching is to define interconnects (and accompanying contacts or vias) in a layer of aluminum or aluminum alloy deposited over an interlayer dielectric. Once the generally planar aluminum layer has been deposited over the interlayer dielectric and into the contact or via holes, a photomask is deposited and defined over the aluminum layer. Then, an etching gas is admitted into the plasma etch chamber and excited into the plasma state. It has long been known that a chlorine-based chemistry is effective at etching aluminum. See, for example, U.S. Pat. No. 5,387,556 to Xiaobing et al. Gaseous hydrochloric acid (HCl) is the prototypical chlorine-based etchant. However, HCl is no longer considered the optimum aluminum etchant.

Aluminum quickly forms an overlying layer of a native oxide of alumina ($Al_2O_3$) and related materials forming a residue over the metallic aluminum being etched. Alumina is a very stable material and resistant to reductive breakdown, even by HCl. For these reasons, a plasma etch of $BCl_3$, often in conjunction with HCl or $Cl_2$, is often used for etching aluminum and its alloys. Wang et al. in U.S. Pat. No. 5,219,485 use a similar chemistry to etch suicides in order to avoid residues from the silicide etch.

However, the use of a powerful etchant like $BCl_3$ introduces a problem originating from the fact that the chamber is most economically made of aluminum, for example the alloy Al6061-T6. The seminal problem is that a chamber having an aluminum body and which is used for etching aluminum must balance the etching of the aluminum portion of the substrate against the etching of the chamber body. The physical integrity of the aluminum chamber is not as important as the fact that the etching of the aluminum chamber is likely to produce aluminum-based particles that deleteriously fall on the wafer and reduces its yield of functioning integrated circuits. That is, the chamber wall in a plasma reactor intended for aluminum etching must not be composed of raw aluminum.

For these reasons, it has been known to coat the wall of a plasma reactor for metal etching with an etch-resistant coating. Steger describes such an approach in U.S. Pat. No. 5,268,200 in which a protective coating of an electrically conductive hydrogen-containing layer is deposited on the aluminum wall. Another more typical approach is to coat the aluminum body with a surface layer of alumina. This surface coating of alumina is usually achieved by anodization of the underlying aluminum. Raw aluminum quickly forms with a native oxide of $Al_2O_3$ to thickness of about 2.5 nm. However, further increases in the oxide thickness are quickly inhibited by the robustness of the aluminum oxide layer. Electrolytic anodization of the aluminum body easily increases the alumina thickness to 25 to 75 $\mu$m. Anodization of aluminum and aluminum-based alloys is well known. Typically, the aluminum body is submerged in a bath of electrolyte, for example, of 15 vol % solution of $H_2SO_4$, and the aluminum body is connected as an anode to one terminal of an electrical power supply while a cathode submersed in the electrolyte is connected to the other terminal. Thereby, the aluminum is electrolytically oxidized by applying DC current. The first layer of a few tens of nanometers of anodization presents a relatively dense barrier. However, further increases in the anodization thickness produces a relatively porous material. Pore size can be reduced by reducing the temperature of the anodization bath, but inevitably the thicker anodizations lack the robustness of a native aluminum oxide layer or the initial barrier layer.

Anodized aluminum has been an object of much development for its use in plasma reactors, particularly metal etch reactors. The fundamental objective has been to reduce the etching of the anodized aluminum chamber wall relative to the etching of the alumina-based residues resulting from the etching of the aluminum lines. Etching of the anodized aluminum wall in a metal etch reactor is a particular problem since anodized aluminum is fundamentally alumina and $BCl_3$ is being used for its effective removal of alumina The reaction of $BCl_3$ and $Al_2O_3$ is exothermic following the reaction $$Al_2O_3 + 2BCl_3 \rightarrow 2AlCl_3\uparrow + B_2O_3, \Delta G°_f(-15.19 \text{ kcal/mol}), \quad (1)$$

where $\Delta G°_f$ is the reaction Gibbs free energy and the stated value is at 100° C.

A first observation has been that anodized aluminum tends to be relatively light and porous. A denser alumina layer would perhaps be more resistant to etching relative to a residue on the aluminum being etched and would further reduce water uptake in the alumina, which complicates its use inside a vacuum chamber. Many attempts have been made to improve the quality of the anodized layer. One such approach uses hot deionized (DI) water in the anodization process so as to seal the anodized layer with a layer of boehmite (AlOOH), which forms according to the reaction $$Al_2O_3 + H_2O \rightarrow 2AlOOH\downarrow, \Delta G°_f(-468.68 \text{ kcal/mol}). \quad (2)$$

Boehmite is chemically stable in the presence of $BCl_3$, as seen by the reaction $$2AlOOH + 2BCl_3 \rightarrow 2AlCl_3 + B_2O_3 + H_2O, \Delta G°_f(+398.03 \text{ kcal/mol}), (3)$$

but boehmite is not a hard material and is not stable due to dehydration. While the reaction is useful for filling the pores of the anodized aluminum, the hot deionized water sealing after anodization is insufficient for the present needs.

The requirements for a corrosion-resistant coating have intensified recently with the introduction of plasma etch reactors utilizing high-density plasmas. High-density plasma (HDP) reactors have been recently developed for a number of processes. Generally, a high-density plasma is defined as one having an ionized plasma density of greater than $10^{11}$ cm$^{-3}$. An example of an HDP metal-etch reactor is the Decoupled Plasma Source (DPS) Metal Etch Chamber available from Applied Materials, Inc. of Santa Clara, Calif. Tepman et al. have described an early version of the DPS reactor chamber in U.S. patent application, Ser. No. 08/296, 043, filed Aug. 23, 1994 and incorporated herein by reference. The corresponding European application has been published as European Patent Application, 698,915-A1. The mechanical structure has changed somewhat in the commercial version of the DPS chamber.

A schematic representation of the commercial DPS chamber is illustrated in the cross-sectional view of FIG. 1. A upper, main processing compartment 10 is bounded by a curved ceramic dome 12, an upper housing 14 to which the ceramic dome 12 is sealed, and a movable pedestal wall 16 that is vertically movable to engage and seal within an inwardly extending annular shelf 18 of the upper housing 14. The upper housing 14 rests on and is sealed to a lower housing 20, and a bellows 22 is sealed to the bottom of the lower housing 20 and to a stem 24 extending downwardly from the pedestal wall 16. An electrode 19 may be included at the center of the dome 12. A lower compartment 26 is defined generally by the walls of the lower housing 20 and the lower edge of the annular shelf 18. During plasma processing, the movable pedestal wall 16 seals the upper compartment 10 from the lower compartment 22 by engaging and sealing the annular shelf 18 of the upper housing 14.

A vertical actuator 28 connected to the bottom of the stem 24 can move the pedestal wall 16 into and out of engagement with the annular shelf 18. An unillustrated robot blade can transfer a wafer 30 into the lower compartment through a loadlock slit 32 in the lower housing 20 and its unillustrated slit valve when the vertical actuator 28 has lowered the pedestal wall 16 to a position to receive the wafer 30 on its upper surface. The pedestal wall 16 typically includes an electrostatic chuck to selectively hold the wafer 30 by electrostatic attraction exerted by an electrical signal applied to the chuck. After the wafer has been deposited on the pedestal wall 16, the vertical actuator 28 raises the pedestal wall 16 so that it seals the upper compartment 10 and places the wafer within the upper compartment 10.

The upper housing 14 also includes a turbo port 38 connecting to an integral pumping stack 40. A vacuum pumping system 42 mated with the bottom of a pumping stack 40 pumps the upper compartment 10 as well as the lower compartment 26 when it is opened to the upper compartment 10. A poppet valve 44 fixed to the upper housing 14 over the pumping stack 40 can selectively isolate the upper compartment 10 from the vacuum pumping system 42.

Processing gas, which for aluminum etching typically includes BCl$_3$ is injected into the sealed upper compartment 10 through a plurality, typically four, of unillustrated gas nozzles fixed to the radially inner ends of respective gas orifices 46 penetrating the upper housing 14 near its top. RF power is applied to an inductive coil 48 wrapped around the curved dome 12 so as to create a high-density plasma of the processing gas within the upper compartment 10. RF power is also applied to the pedestal wall 16 and possibly to a counter electrode fixed in the curved dome 12 so as to bias the plasma to effect the desired etching of the wafer.

The upper housing 14, as more clearly illustrated in the perspective view of FIG. 2, is a large, complexly shaped part having portions that are relatively inaccessible. As long as it can be formed of aluminum alloys, its manufacturing cost can be kept low, despite its complex shape, and it is relatively easy to anodize because anodization is a wet process.

However, it has been found that the use of a high-density BCl$_3$ plasma intensifies the problem with chamber walls of anodized aluminum. A relatively high alumina etch rate has been observed in a circumferential band of the chamber wall around the gas jets and around the upper portion of the turbo port 38. The alumina etch is so strong in this band that with normal anodizations, the anodization is eroded away in spots within a week of steady use. At that point, a major portion of the chamber needs to be replaced.

We performed tests to determine quantitative erosion rates on coupons 49, as illustrated in FIG. 3, of anodized aluminum placed into the DPS chamber at various places inside the dome 12, on the chamber wall 14 near the turbo port 38, and, although not illustrated, on the pedestal 16 atop an aluminum nitride dummy wafer 30. The chamber was run with a standard commercial recipe including BCl$_3$, Cl$_2$, and Ar for 360 minutes with the RF turned on for 240 minutes of this time. The listed numbers are anodization erosion rates in micrometers per hour. The maximum erosion occurred at the top of the chamber wall adjacent to the turbo port 38, at which point the anodization erosion rate was measured to be 3.3 $\mu$m per hour, an unacceptably high rate.

It has been found that the alumina etch rate in a high-density BCl$_3$ plasma can be reduced by including some nitrogen in the etch processing gas. A series of tests used a gas flow having active components of about 90 sccm of Cl$_2$, about 75 sccm of BCl$_3$, and about 40 sccm of Ar in a high-density plasma reactor. Without any nitrogen, anodization erosion rates of up to between 0.87 to 1.4 $\mu$m/hr were measured. However, with the addition of between 5 to 20 sccm of N$_2$, the erosion rate was reduced to between 76 to 130 nm/hr.

However, the addition of nitrogen to the etching gas is disfavored for at least two reasons. The addition of any gas for a non-etching purpose complicates the optimization process for the etching. A good commercial process requires a wide process window for pressure, temperature, gas flow, etc. to assure uniformity and repeatability in the etching. Almost inevitably, a more complex gas reduces the process window. Furthermore, nitrogen has been observed in a chlorine-based etch process to cause a build up of deposits on the chamber wall. The build up needs to be periodically removed by manual cleaning. Such cleaning reduces throughput, requires operator time, and may itself introduce particles into the chamber. Chamber erosion in plasma etch reactors is an old problem, and much development work has been devoted to improved and new materials. However, we have found that the conventional available materials exhibit unacceptably high erosion rates in the environment of a high-density BCl$_3$ and Cl$_2$ plasma. Several coupons of different materials were tested under the same conditions as given above for the anodization tests. The results are shown in TABLE 1, where the weight loss is measured for standard sized coupons.

TABLE 1

| Material | Manufacturer | Weight Loss % |
| --- | --- | --- |
| Alumina Type 1 | A | 0.112 |
| Alumina Type 2 | A | 0.256 |
| Alumina | B | 0.262 |
| Titania | C | 0.373 |
| Silicon Carbide | D | 0.239 |
| Silicon Carbide Improved | D | 0.278 |
| Sapphire |   | 0.393 |

These results show that standard techniques of protecting the wall are not adequate for advanced metal etchers.

SUMMARY OF THE INVENTION

Accordingly, an object of the invention is to find a durable material for walls and other components in plasma reactors.

In a use of the invention, the wall or other component in a plasma reactor has at least a surface portion facing the plasma composed of boron carbide, preferably predominantly $B_4C$. The boron carbide may be either a bulk material or may be a surface layer coated on a gross member.

Boron carbide is preferably thermally sprayed onto a surface of aluminum that is bare except for a native oxide. Nonetheless, according to an aspect of the invention, boron carbide can be effectively sprayed onto an anodization layer if the underlying aluminum is roughened prior to the anodization. When, the part of the anodization is removed for spray coating, a band of the underlying aluminum surrounding the transition is preferably roughened prior to anodization so the boron carbide is sprayed both onto the bare aluminum and also onto a narrow surrounding portion of the anodization.

A surface of boron carbide is particularly useful as a wall in a plasma etch reactor in which boron trichloride is used as the etchant for aluminum-based materials, and the utility increases for higher plasma densities.

Erosion rates are strongly dependent upon position within the chamber and should be measured at a variety of locations.

Due to the variation of erosion rates, the boron carbide coating or bulk part can be used selectively in those locations exhibiting the highest erosion.

BRIEF DESCRIPTION OF THE DRAWINGS

FIG. 1 is schematic cross-sectional view of a plasma reactor to which the invention can be applied.

FIG. 2 is a perspective view of a part of the plasma reactor of FIG. 1 and shows the view line 1—1 of FIG. 1.

FIG. 3 is a schematic view of the placement of coupons within a plasma reactor for erosion testing.

FIG. 4 is a perspective view of a boron carbide member formed for use in a plasma reactor.

FIG. 5 is a cross-sectional view of a member partially covered with a thermally sprayed coating.

FIG. 6 is a micrograph of boron carbide thermally sprayed on bare aluminum.

FIGS. 7 and 8 are micrographs at two magnifications of boron carbide thermally sprayed on anodized aluminum.

FIG. 9 is a micrograph of boron carbide CVD deposited on aluminum.

DETAILED DESCRIPTION OF THE PREFERRED EMBODIMENTS

We have found that boron carbide, particularly $B_4C$, is resistant to a high-density $BCl_3$ plasma. Boron carbide is a well known material outside of the semiconductor industry. Shaffer provides an overview of the material in "Engineering Properties of Carbides," *Engineered Materials Handbook*, vol. 4, "Ceramics and Glasses" (Materials Information Society, 1991), pp. 804–807, 843, 844. It is widely used as an abrasive and as a moderator for thermal neutrons in nuclear reactors. Stoichiometric $B_4C$ has a carbon weight fraction of 21.72%. Shaffer states that most commercial boron carbide is a composite of $B_4C$ and graphitic carbon. On the boron-rich side of $B_4C$, stoichiometric $B_{13}C_2$ (14.6 wt % of carbon) has been identified. No stoichiometric phase has been identified on the carbon-rich side. The boron-carbon phase diagram shows eutectics at about 2160° C. for 30 wt % of carbon and at about 1900° C. for 2 wt % of carbon. No liquid phase exists below the lower of these temperatures, and the melting point of $B_4C$ is given as 2450° C. These various compositions show that an interesting range of boron carbide concentrations extends from 14 to 30 wt % of carbon, and a yet more interesting range extends from 18 to 25 wt % of carbon. The coefficient of thermal expansion for $B_4C$ is about $5.54 \times 10^{-6}/°$ C. Its thermal conductivity is in the range of 28 to 80 W/m°K at the temperatures contemplated for semiconductor processes, and its room temperature electrical resistivity is in the range of 0.1 to 10 ohm-cm. Its low electrical resistivity allows a chamber wall composed of boron carbide to be electrically grounded or even biased, as is required for some etching processes.

$B_4C$ and SiC are the only known covalent carbides, and $B_4C$ forms with a rhombohedral crystallographic structure. Other common carbides which comprise Ti, Sr, Nb, Ta, Mo, W, Fe, Co, and Ni are interstitial carbides. The covalent carbides show excellent thermal and chemical stability and extreme hardness.

Boron carbide is commercially available in at least three forms, sintered or hot-pressed, thermally sprayed, CVD (chemical vapor deposition), and a conversion coating.

Since hot pressing is a variant of sintering, the two processes will be discussed together. Sintering of $B_4C$ is a developed technology. See, for example, U.S. Pat. No. 5,081,077 to Tani et al. and Shaffer, ibid., and the references cited therein. Sintering consolidates a powder of boron carbide into a gross body, and the composition of the powder determines the composition of the sintered body. $B_4C$ powder is commercially available from Hardface Alloys, Inc. of Sante Fe Springs, Calif. An improved type of this $B_4C$ powder has had its impurity levels characterized with the highest impurity levels being 2000 ppm for silicon, 500 ppm for iron, 270 ppm for aluminum, and 48 ppm for magnesium. Commercial suppliers of custom shaped $B_4C$ sintered parts include Ceradyne, Inc. of Orange County, California.

Sintering allows bodies of somewhat complex shape to be formed, including most chamber parts. However, in view of the apparent need to sinter $B_4C$ under pressure, it is preferable to form less complex shapes and to machine the sintered body to conform to fabrication tolerances. We now know that only portions of the upper housing 14 of FIGS. 1 and 2 are subject to extensive erosion of the aluminum anodization. Hence, it is preferred to separately form the portion of the upper housing 14 above the turbo port 38 as a spacer ring 50, illustrated in perspective in FIG. 4, which would be placed between a vertically truncated upper housing 14 and the ceramic dome 12 with necessary vacuum seals placed between the three members. If necessary, gas orifices 52 may be formed in the ring 50, but it is preferred that these be moved to the readily machinable aluminum upper housing 14 if the relocation does not degrade the process nor move the erosion into the anodized upper housing.

A hot-pressed $B_4C$ spacer ring has been obtained of the proper dimensions for the chamber of FIG. 1. It did not contain any nozzle holes, but an O-ring groove was machined into one of the annular end faces with a diamond-tipped tool.

The second method of forming the boron carbide surface is to thermally spray a relatively thin layer of boron carbide onto a substrate already formed in the desired shape.

Thermal spraying is a somewhat generic term including a number of distinct processes, as is explained by Pawlowski in *The Science and Engineering of Thermal Spray Coatings* (Wiley, 1995), pp. 28–52. Most of the methods use a powder having the desired final composition, in this case of boron carbide, and preferably of high-purity $B_4C$.

In flame spraying, the powder is mixed with a combustible gas and is ejected at high velocity through a high-temperature flame of the gas toward the substrate to be coated. The powder arrives at the substrate in a molten state. In high-velocity oxy-fuel spraying, the powder is mixed into a burning fuel stream.

In atmospheric plasma spraying, the powder is mixed into a stream of inert gas passing at high velocity between two electrodes. The electrically biased electrodes form a plasma (gas discharge) of the gas with a very high effective temperature. The plasma-heated gas and entrained molten powder is directed at the substrate to be coated. In vacuum plasma spraying, the powder is mixed into a plasma beam traveling through a vacuum toward the substrate. Plasma spraying services are available from APS Materials, Inc. of Dayton, Ohio.

In detonation-gun spraying, powder and combustible gas are charged into a closed end of a barrel similar to a gun barrel, a spark plug ignites the gas, and the exploding gas exhaust and entrained molten powder blow out the open end of the barrel toward the substrate. Detonation-gun spraying is available as D-gun™ coatings from Praxair S.T., Inc. of Indianapolis, Ind.

Other variants of these thermal spray processes are available in which, like the above described processes, a powder of nearly arbitrary compositions is heated in a high-temperature gas stream to above its melting point. The resultant high-velocity gas stream and entrained molten powder material strike the substrate to be coated. The molten powder solidifies on contact with the substrate to form the coating of the powder material.

Many forms of thermal spraying can be economically performed. However, they generally require relatively large spray guns, at least of size on the order of a hand gun, and the spray angle needs to be nearly normal to the surface being coated or, at least in some processes, at greater than a glancing angle. As a result, coating complexly shaped parts of moderate size presents a problem. For example, it would be very difficult to coat the inside of the turbo port 38 or the pump stack 40 in the upper housing 14 of FIGS. 1 and 2.

However, we have found that only an annular band on the inner cylindrical surface above the turbo port is subjected to significant erosion. Based on this observation, we have fabricated and tested an aluminum upper housing with a combined inner coating of anodized aluminum and boron carbide. The important data derived from using widely spaced test strips to measure erosion or other effect within the chamber, as illustrated in FIG. 3, demonstrate the utility of this inventive test procedure.

A portion of one aluminum upper housing 14 is illustrated in cross section in FIG. 5 having an O-ring groove 53 machined into its upper rim. The upper housing is anodized on all sides except the upper rim with a standard anodization layer 54 having a thickness of about 75 µm and is sealed in a deionized water bath after anodization. On the upper rim, the anodization is machined away over the O-ring groove 53 during its forming. The anodization is also removed on one side and replaced by a nickel plating 55 to provide electrical contact between chamber parts.

However, conventional smooth anodized aluminum does not provide a good base for thermally sprayed boron carbide, and the boron carbide tends to peel from the anodization over a smooth aluminum surface. It is believed that the alumina is excessively hard and resists any bonding with the high-velocity sprayed material. It is preferred that the boron carbide be sprayed on raw aluminum, which is softer and more readily bonds to the boron carbide. Therefore, an annular band 56 of the upper housing 14 that is subject to significant erosion is masked off, and grit blasting removes the anodized layer 54 within the band 56. Then, a thermal spray of $B_4C$ is directed to the annular band 54 and to slightly outside it to form a $B_4C$ layer 58 over the aluminum of the upper housing 14. Thermal spray coating thicknesses of 5 to 10 mils (125 to 250 µm) have been achieved and seem adequate in view of the low erosion rates described below. The aluminum exposed between the grit blasting and the thermal spraying quickly forms a native oxide layer, but this has been shown to provide a good base for the thermally sprayed layer 54.

Many test coupons have been thermally sprayed. A scanning electron microscopy (SEM) micrograph of one coupon is shown in FIG. 6 in which $B_4C$ was plasma sprayed onto a substrate of the aluminum alloy Al6061-T6 to a thickness of about 400 µm. After coating, the coupon was sectioned, and the exposed edge was polished. The aluminum substrate is shown at the left, and has had its surface roughened by grit blasting to a surface roughness of between 50 and 75 µm. The roughening is not considered necessary, but it does increase the cohesion of the thermally sprayed coating on the aluminum. In general, the roughness should be less than the thickness of the boron carbide coating. The material at the right is a mounting material used in the sectioning of the sample. The boron carbide shows substantial pitting to the aluminum, which results from the polishing process peeling away particles of boron carbide, but the cavitation decreases towards its free surface, which is relatively smooth. Surface peel tests of plasma sprayed $B_4C$ on bare aluminum have shown a consistent peel strength of greater than 1000 psi ($7 \times 10^6$ Nt/m$^2$).

However, a more serious potential problem arises in the tail 60 of the $B_4C$ layer 58 overlying the edge of the anodized layer 54. Since we know that $B_4C$ tends to peel from anodized aluminum, it is not clear that the tail 60 would not also peel. Any peeling would allow the $BCl_3$ to undercut the $B_4C$ and to eventually attack bare aluminum.

To alleviate this problem, prior to anodization, the chamber wall 14 is roughened within a band 62 surrounding the intended end of the exposed band 56. The roughened band 62 extends across the intended transition between the anodized layer 54 and the exposed band 56 where the boron carbide will be sprayed onto the bare aluminum. It should include a substantial portion underlying the area of the anodization 54 left remaining so as to accommodate the boron carbide tail 60. Also, a somewhat small annular band around each of the gas nozzle holes 52 is roughened, and the $B_4C$ is sprayed around and inside the nozzle holes 52. The roughening is performed by grit blasting and produces a surface finish $R_a$ about 100 to 150 microinches (2.5 to 3.8 $\mu$m) although the roughness would be effective within a wider range of 100 to 300 microinches (2.5 to 7.6 $\mu$m). When the roughened aluminum is then anodized to a thickness of about 60 to 75 $\mu$m, the surface of the anodization is correspondingly roughened. Tests have shown that peel strengths of sprayed $B_4C$ coatings on roughened anodizations are increased. The results above for coating bare roughened aluminum show that much greater roughness is still effective as long as an integral anodized layer of finite thickness can be formed over the roughen aluminum.

An aluminum upper housing 14 was fabricated with the general structure shown in the perspective view of FIG. 2. The stippled area 58 represents the area of $B_4C$ spray coating.

Test coupons were fabricated to demonstrate the feasibility of spray coating boron carbide over anodized aluminum. A micrograph in FIG. 7 shows the roughened aluminum alloy substrate on the left, and about 25 $\mu$m of anodization over the substrate. The substrate roughness propagates through the anodization. A $B_4C$ layer was then plasma sprayed over the anodization to a thickness of about 225 $\mu$m. Its surface was relatively smooth compared to that of the anodization. Again, the material on the extreme right is only for mounting the sample. Substantial cavitation of the $B_4C$ occurred adjacent to the anodization, although it is not apparent in the micrograph of FIG. 7. However, the cavitation decreased toward the $B_4C$ upper surface, as shown in the micrograph of FIG. 8, which at 5 times the magnification of the micrograph of FIG. 7.

In an alternative embodiment, none of the anodization is removed, but all the portions of the chamber wall which are to be $B_4C$ sprayed are roughened prior to anodization. The resultant thermally sprayed $B_4C$ coating has been observed to adequately adhere to the anodization.

The selective deposition of boron carbide onto otherwise anodized aluminum is particularly cost effective. Even the relatively inexpensive thermal spraying needs to be performed only on a relatively small area that is easily accessible to conventional spray guns.

As far as we know, boron carbide has never before been deposited on aluminum.

A third method of forming a boron carbide surface is to deposit boron carbide by chemical vapor deposition (CVD). The deposition of $B_4C$ films by thermal deposition has been described by Stinton et al. in "Advanced Ceramics by Chemical Deposition Techniques," *American Ceramics Society Bulletin*, vol. 67, no. 2, 1988, pp. 350–55. The gaseous precursors are $BCl_3$, $CH_4$, and $H_2$, and the thermal deposition temperatures is between 1200 and 1400° C. A commercial supplier of thermal CVD boron carbide coatings is Ultranet, Inc. of Los Angeles, Calif. It is possible to deposit boron carbide by a plasma-enhanced CVD process, as is done for a wide class of other materials. Known precursors for PECVD of boron carbide are $B_2H_6$ and $CH_4$. Plasma CVD allows the use of substrates having a much lower melting point. The use of $BCl_3$ as a precursor for $B_4C$ shows the unlikelihood that $B_4C$ will be etched by $BCl_3$. Furthermore, the elevated CVD temperature relative to the operating temperatures of plasma etch reactors, typically no more than 200 to 300° C., shows that the $B_4C$ will remain stable.

CVD films of $B_4C$ have been thermally grown on graphite coupons. An SEM micrograph of one is shown in FIG. 9. The graphite substrate on the left. The $B_4C$ is CVD deposited to a thickness of about 180 $\mu$m, The material on the right is only for mounting. The micrograph shows that the CVD boron carbide has a bumpy surface with surface features of about 30 $\mu$m height despite the relatively smooth graphite substrate. We have found it advantageous to polish the CVD $B_4C$ films with a 600-grit silicon carbide polishing paper to provide a much smoother surface. Thereby, the $B_4C$ layer inside the plasma reactor can be easily swabbed during routine chamber cleaning. It is anticipated that with more process development in CVD boron carbide, the bumps can be reduced or eliminated.

A fourth method of forming a boron carbide surface is surface conversion in which the to underlying substrate is reacted with a gas or liquid reactant to form boron carbide coated onto the substrate. For example, $B_2O_3$ reacts with a graphite substrate to form boron carbide. Claar discloses examples of this general type of coating process in U.S. Pat. No. 5,250,324. A commercial supplier of conversion coating services is Hitachi Chemicals, Inc. of Tokyo, Japan.

A number of coupons, both of the invention and comparative samples, were prepared and subjected to the same high-density plasma etch of $BCl_3$, $Cl_2$, and Ar for four hours. The data for the chamber coating is also included. The maximum erosion rates measured on the samples are shown in TABLE 2.

TABLE 2

| Material | Form | Maximum Erosion Rate ($\mu$m/hr) |
|---|---|---|
| $B_4C$ | Bulk | <0.025 |
| $B_4C$ | Plasma spray on chamber wall, 93%-pure $B_4C$ | <0.025 |
| $B_4C$ | Plasma spray on aluminum coupon, 99.7%-pure $B_4C$ | <0.025 |
| $B_4C$ | D-gun on aluminum coupon | <0.025 |
| $B_4C$ | CVD on graphite coupon | <0.025 |
| $ZrO_2$ | D-gun on aluminum | 0.38 |
| Anodization | DI water sealed | 2.84 |
| Anodization | C-276 alloy | 1.78 |
| $Al_2O_3$ | Plasma spray on aluminum | 0.84 |
| $Al_2O_3$ | D-gun | 1.91 |
| $Al_2O_3$ | SD-gun | 0.86 |
| $Al_2O_3$ | SD-gun on anodization | 2.18 |

It is thus seen that $B_4C$ shows vastly reduced erosion rates compared to conventional materials. Erosion rates below 0.025 $\mu$m/hr were not measurable with our experiments. At these erosion rates of a 250 $\mu$m-thick $B_4C$ spray coating, a minimum puncture lifetime is 10,000 hours of operation.

An alternative material that appears to share many of the erosion-resistant qualities of $B_4C$ is silicon nitride, particularly $Si_3N_4$. Initial coupon erosion tests showed nearly equal etching rates for the two materials in a $BCl_3$ high-density plasma. Silicon nitride is available in both bulk and coated forms. Bulk silicon nitride can be formed by sintering. Silicon nitride films are widely used in semiconductor integrated circuits, and their deposition by either thermal or plasma-enhanced CVD is a well developed technology. Alternatively, silicon nitride films can be thermally sprayed by the processes described above. Thus, silicon nitride can be beneficially substituted for boron carbide in all the uses described herein. A disadvantage of silicon nitride relative to boron carbide is its very high electrical resistivity, comparable to that of alumina. Hence, a chamber wall of $Si_3N_4$ cannot be electrically controlled.

An important consideration for a coating inside a vacuum chamber is the amount of water uptake. Plasma reactors being used for semiconductor processing need to be kept clean, and thus they need to be periodically wet cleaned. If the wall takes up too much water in the cleaning process, it may require several hours of pump down to return the vacuum to the desired layer. A series of experiments were performed on sintered and plasma sprayed coupons. The coupons were boiled in water for 1 hour, heated in air at 130° C. for three hours, and again wiped to remove white deposits which tended to form. The weights before and after this test procedure were compared and normalized to the surface areas. The inventive samples showed surface water absorption in the range of 0.0009 to 0.0018 $g/cm^2$, which we believe are very good. Operationally, we found that a $B_4C$ coating chamber after wet cleaning could be rapidly pumped down to a high vacuum.

Much development has been expended on proving etch processes based upon standard anodized reactor chambers. Acceptance of the boron carbide reactor of the invention would be greatly expedited if the substitution of boron carbide for anodized surfaces can be shown to only minimally impact the process. For this reason, a standard metal etch recipe was used both in a conventionally anodized chamber and a chamber having a ring its wall covered with plasma sprayed $B_4C$. The etch recipe included $BCl_3$, $Cl_2$, and Ar at a chamber pressure of 12 mTorr. The inductively coupled plasma source power was about 1500 W, and the pedestal was biased with between 145 and 200 W of RF power. The boron carbide chamber showed a marginally lower aluminum etch rate and a marginally higher oxide etch rate. The etch uniformity was somewhat better for the boron carbide chamber. The vertical profile and smoothness of the exposed aluminum lines were indistinguishable between the two reactors. The selectivity between aluminum and photoresist decreased by about 5%. Both reactors produced a residue-free aluminum etch. Particle tests have shown that the boron carbide coating does not substantially increase the number of particles. Metal contaminants in the wafer are acceptable.

Similar processing compatibility tests were performed with the chamber uniformly coated with $B_4C$ over anodized aluminum. Again, only minimal differences were observed.

Based on these results, it is seen that boron carbide has minimal effect on the standard metal etch processes.

Although the major examples have included an aluminum chamber for a metal etch reactor, the invention is not so limited. Aluminum-based materials are herein meant to include aluminum-containing materials that can be anodized to form alumina. Aluminum-based materials include substantially pure aluminum as well as aluminum alloy. An aluminum alloy is understood to include materials including at least 90 wt % elemental aluminum and additional constituents, such as copper or silicon.

However, boron carbide can be coated on other materials, such as stainless steel and other steels. Graphite has already been described as a substrate.

Boron trichloride is a particularly harsh etchant, but other plasma processes introduce chamber problems that can be beneficially addressed by the invention.

Although the invention has been described with respect to chamber walls, other parts within plasma reactors can benefit from the invention, for example, electrostatic chucks, wafer clamps, plasma focus rings, nozzles and showerheads for processing gas, etc. The invention can also be applied to remote plasma sources and their conduits into a main processing chamber. A remote plasma source excites at least one constituent of the processing gas into a plasma prior to the gas entering the main chamber.

It is thus seen that invention can substantially reduce a costly problem with erosion by a low-cost, flexible method that has minimal impact on the plasma process. A chamber wall or part within the chamber is assured a relatively long production life despite the corrosive nature of a plasma.

What is claimed is:

1. A method of forming a boron carbide layer on an aluminum-based substrate, comprising:

an initial step of anodizing a surface of an aluminum-based substrate to form an anodization layer;

then removing said anodization layer from a first portion of said substrate separated by a predetermined boundary from a second portion of said substrate from which said anodization layer is not removed; and then depositing a boron carbide layer upon said anodization layer, wherein said depositing step deposits said boron carbide layer in a layer extending over said first portion of said substrate and across said boundary to a neighboring part of said second portion of said substrate.

2. A method of forming a boron carbide layer on an aluminum-based substrate, comprising:

an initial step of roughening at least a first portion of a surface of an aluminum-based substrate;

anodizing said surface of said aluminum-based substrate to form an anodization layer, wherein said anodizing step anodizes said first portion;

removing said anodization layer from a second portion of said substrate adjacent to said first portion and separated therefrom by a predetermined boundary, said roughened first portion extending below a portion of said anodization left by said removing step; and then depositing a boron carbide layer upon said anodization layer, wherein said depositing step deposits said boron carbide layer on said anodization layer overlying said anodized first portion.

3. The method of claim 2, wherein a material of said substrate is selected from the group consisting of aluminum and aluminum alloys.

4. The method of claim 2, wherein said boron carbide layer comprises $B_4C$.

5. The method of claim 2, wherein said boron carbide layer comprises particles of $B_4C$.

6. The method of claim 2, wherein said boron carbide layer comprises a composition between $B_4C$ and $B_{13}C_3$.

7. The method of claim 2, wherein said boron carbide layer comprises between 14 to 30 wt % of carbon relative to a total weight of carbon and boron.

8. The structure of claim 7, wherein said boron carbide layer comprises between 18 to 25 wt % of carbon relative to a total weight of carbon and boron.

9. The process of claim 2, wherein said boron carbide layer is deposited onto said anodized first portion and second portion of said substrate.

10. A method of coating boron carbide on an aluminum-based substrate, comprising the steps of:

roughening a surface of a substrate to a value of surface finish $R_a$ of at least 2.5 μm, wherein said substrate is composed of an aluminum-based material selected from the group consisting of substantially pure aluminum and aluminum alloys including at least 90 wt % elemental aluminum;

anodizing said substrate to form an anodization layer;

removing said anodization layer from only a first portion and not from a second portion of said surface of said substrate; and depositing a boron carbide layer upon said anodization layer, wherein said boron carbide layer is deposited on both said fist and second portions after said removing step.

11. The method of claim 10, wherein said depositing step comprises thermal spraying to form said boron carbide layer upon said surface.

12. The method of claim 10, wherein said depositing step comprises chemical vapor deposition.

13. The method of claim 10, wherein said boron carbide layer comprises $B_4C$.

14. The method of claim 10, wherein said boron carbide layer comprises particles of $B_4C$.

15. The method of claim 10, wherein said boron carbide layer comprises a composition between $B_4C$ and $B_{13}C_3$.

16. The method of claim 10, wherein said boron carbide layer comprises between 14 to 30 wt % of carbon relative to a total weight of carbon and boron.

17. The structure of claim 16, wherein said boron carbide layer comprises between 18 to 25 wt % of carbon relative to a total weight of carbon and boron.

18. The structure of claim 10, wherein said roughening step is performed before said anodizing step.

19. The method of claim 10, wherein said surface finish $R_a$ is no more than 7.6 μm.

20. The method of claim 19, wherein said first and second parts are only partially co-extensive.

21. The method of claim 19, wherein said anodization layer contacts roughened and unroughened portions of said surface and said boron carbide layer contacts other roughened and unroughened portions of said surface.

22. The method of claim 21, wherein said boron carbide layer only partially covers said anodization layer.

* * * * *